United States Patent
Kim et al.

(10) Patent No.: US 12,074,427 B2
(45) Date of Patent: Aug. 27, 2024

(54) INPUT SENSOR SHORT-CIRCUIT INSPECTION MODULE AND INPUT SENSOR SHORT-CIRCUIT INSPECTION METHOD USING THE SAME

(71) Applicant: Samsung Display Co., Ltd., Yongin-si (KR)

(72) Inventors: Min-Hong Kim, Hwaseong-si (KR); Taejoon Kim, Seongnam-si (KR); Jungmok Park, Hwaseong-si (KR); Hyun-Wook Cho, Yongin-si (KR); Jaewoo Choi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 140 days.

(21) Appl. No.: 17/865,422

(22) Filed: Jul. 15, 2022

(65) Prior Publication Data
US 2023/0064190 A1    Mar. 2, 2023

(30) Foreign Application Priority Data

Aug. 3, 2021   (KR) .......................... 10-2021-0101692

(51) Int. Cl.
*H02H 3/24* (2006.01)
*G01R 27/02* (2006.01)
*G01R 31/28* (2006.01)
*G01R 31/50* (2020.01)

(52) U.S. Cl.
CPC ............ *H02H 3/24* (2013.01); *G01R 27/025* (2013.01); *G01R 31/2837* (2013.01); *G01R 31/50* (2020.01)

(58) Field of Classification Search
CPC ........ H02H 3/24; G01R 31/50; G01R 27/025; G01R 31/2837
See application file for complete search history.

(56) References Cited

U.S. PATENT DOCUMENTS

| | | | |
|---|---|---|---|
| 8,643,993 B2 | 2/2014 | Tsai et al. | |
| 2011/0050620 A1* | 3/2011 | Hristov | G06F 3/04184 345/174 |
| 2012/0293336 A1* | 11/2012 | Pereverzev | G06F 3/0446 340/635 |
| 2016/0364068 A1* | 12/2016 | Cheng | G06F 3/0412 |
| 2021/0247859 A1* | 8/2021 | Gong | G09G 3/006 |

FOREIGN PATENT DOCUMENTS

| | | |
|---|---|---|
| KR | 10-1311690 | 9/2013 |
| KR | 10-1430040 | 8/2014 |
| KR | 10-1610577 | 4/2016 |
| KR | 10-2035997 | 10/2019 |

\* cited by examiner

*Primary Examiner* — Scott Bauer
(74) *Attorney, Agent, or Firm* — Lewis Roca Rothgerber Christie LLP

(57) ABSTRACT

An input sensor short-circuit inspection method including: setting an inspection frequency for detecting a short-circuit of an input sensor comprising a plurality of electrodes; driving the input sensor in an inspection mode at the set inspection frequency; and detecting the short-circuit of the input sensor based on a capacitance charged between adjacent electrodes among the plurality of electrodes of the input sensor in the inspection mode.

20 Claims, 10 Drawing Sheets

INPUT SENSOR SHORT-CIRCUIT INSPECTION MODULE AND INPUT SENSOR SHORT-CIRCUIT INSPECTION METHOD USING THE SAME

CROSS-REFERENCE TO RELATED APPLICATIONS

This application claims priority to and the benefit of Korean Patent Application No. 10-2021-0101692, filed Aug. 3, 2021, which is hereby incorporated by reference for all purposes as if fully set forth herein.

BACKGROUND

Field

One or more embodiments generally relate to an input sensor short-circuit inspection module and an input sensor short-circuit inspection method using the same, and more particularly, to an input sensor short-circuit inspection module capable of detecting a micro short-circuit and an input sensor short-circuit inspection method using the same.

Discussion

Various display modules are being developed for use in (or with) multimedia devices, such as televisions, mobile phones, tablet computers, navigation devices, smart watches, game consoles, and the like. A conventional display module typically includes a pixel and a driving circuit. In addition, display modules may include an input sensor that recognizes a user's touch and a driving circuit for the input sensor.

The above information disclosed in this section is only for understanding the background of the inventive concepts, and, therefore, may contain information that does not form prior art.

SUMMARY

One or more embodiments provide a short-circuit inspection module in a driving circuit capable of detecting a micro short-circuit of an input sensor.

One or more embodiments provide a short-circuit inspection method capable of detecting a micro short-circuit of an input sensor.

According to an embodiment, an input sensor short-circuit inspection method includes: setting an inspection frequency for detecting a short-circuit of an input sensor comprising a plurality of electrodes; driving the input sensor in an inspection mode at the set inspection frequency; and detecting the short-circuit of the input sensor based on a capacitance charged between adjacent electrodes among the plurality of electrodes of the input sensor in the inspection mode.

According to an embodiment, an input short-circuit inspection module includes a frequency setter, a sensor driver, and a short-circuit detector. The frequency setter is configured to set an inspection frequency for detection of a short-circuit of an input sensor. The input sensor includes a plurality of electrodes. The sensor driver is configured to drive the input sensor at the inspection frequency in an inspection mode. The short-circuit detector is configured to detect, in the inspection mode, the short-circuit based on a capacitance charged between adjacent electrodes among the plurality of electrodes.

According to an embodiment, an apparatus includes at least one processor and at least one memory including one or more sequences of one or more instructions that, in response to being executed by the at least one processor, cause the apparatus at least to: set an inspection frequency for detection of a short-circuit of an input sensor, the input sensor comprising a plurality of electrodes; drive the input sensor in an inspection mode at the set inspection frequency; and detect the short-circuit of the input sensor based on capacitances charged between adjacent electrodes among the plurality of electrodes in the inspection mode.

The foregoing general description and the following detailed description are illustrative and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate embodiments of the inventive concepts, and, together with the description, serve to explain principles of the inventive concepts.

DETAILED DESCRIPTION OF SOME EMBODIMENTS

Figure 1:
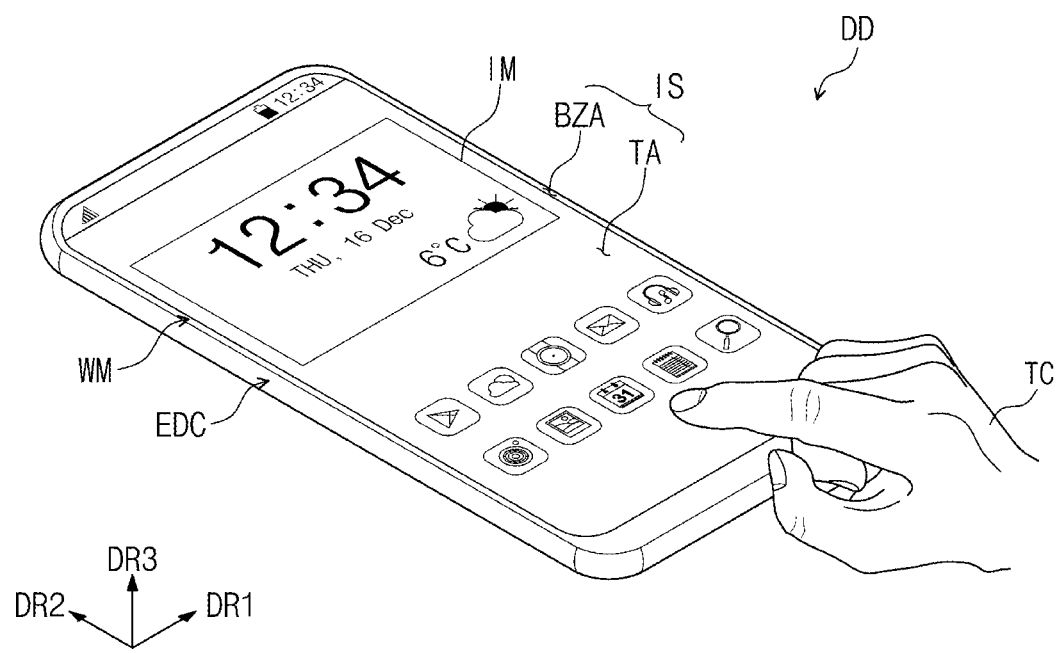
FIG. 1 is a combined perspective view of a display device according to an embodiment.

In the following description, for the purposes of explanation, numerous specific details are set forth in order to provide a thorough understanding of various embodiments. As used herein, the terms "embodiments" and "implementations" may be used interchangeably and are non-limiting examples employing one or more of the inventive concepts disclosed herein. It is apparent, however, that various embodiments may be practiced without these specific details or with one or more equivalent arrangements. In other instances, well-known structures and devices are shown in block diagram form to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing example features of varying detail of some embodiments. Therefore, unless otherwise specified, the features, components, modules, layers, films, panels, regions, aspects, etc. (hereinafter individually or collectively referred to as an "element" or "elements"), of the various illustrations may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. As such, the sizes and relative sizes of the respective elements are not necessarily limited to the sizes and relative sizes shown in the drawings. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. Other terms and/or phrases used to describe a relationship between elements should be interpreted in a like fashion, e.g., "between" versus "directly between," "adjacent" versus "directly adjacent," "on" versus "directly on," etc. Further, the term "connected" may refer to physical, electrical, and/or fluid connection. In addition, the DR1-axis, the DR2-axis, and the DR3-axis are not limited to three axes of a rectangular coordinate system, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing some embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional views, isometric views, perspective views, plan views, and/or exploded illustrations that are schematic illustrations of idealized embodiments and/or intermediate structures. As such, variations from the shapes of the illustrations as a result of, for example, manufacturing techniques and/or tolerances, are to be expected. Thus, embodiments disclosed herein should not be construed as limited to the particular illustrated shapes of regions, but are to include deviations in shapes that result from, for instance, manufacturing. To this end, regions illustrated in the drawings may be schematic in nature and shapes of these regions may not reflect the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor is (e.g., one or more programmed microprocessors and associated circuitry) to perform other functions. Also, each block, unit, and/or module of some embodiments may be physically separated into two or more interacting and discrete blocks, units, and/or modules without departing from the inventive concepts. Further, the blocks, units, and/or modules of some embodiments may be physically combined into more complex blocks, units, and/or modules without departing from the inventive concepts.

Hereinafter, various embodiments will be explained in detail with reference to the accompanying drawings.

FIG. 1 is a combined perspective view of a display device DD according to an embodiment.

Referring to FIG. 1, the display device DD may have a rectangular shape including a short side parallel to a first direction DR1 and a long side parallel to a second direction DR2. However, the shape of the display device DD is not limited thereto.

FIG. 1 illustrates that the display device DD is a smartphone, but embodiments are not limited thereto. For instance, the display device DD may include (or be) a large display device, such as a television, a monitor, etc., or a small or medium-sized display device, such as a tablet, a car navigation system, smart watch, a game console, etc.

As illustrated in FIG. 1, the display device DD may include a display surface IS parallel to each of the first direction DR1 and the second direction DR2. The display surface IS may display an image IM toward a third direction DR3. The display surface IS on which the image IM is displayed may correspond to a front surface of the display device DD.

In some embodiments, a front surface (or an upper surface) and a back surface (or a lower surface) of each member are defined based on the third direction DR3 in which the image IM is displayed. The front surface and the back surface may be opposed to each other in the third direction DR3, and a normal direction of each of the front surface and the back surface may be parallel to the third direction DR3.

A distance between the front surface and the back surface in the third direction DR3 may correspond to a thickness of the display device DD in the third direction DR3. The directions indicated by the first to third directions DR1, DR2, and DR3 are relative concepts and may be changed to different directions.

The display surface IS of the display device DD may be divided into a plurality of areas. The display surface IS of the display device DD may be divided into a transparent area TA and a bezel area BZA.

The transparent area TA may be an area in which the image IM is displayed, and a user recognizes the image IM through the transparent area TA. Although the transparent area TA is illustrated having a rectangular shape with rounded vertices, embodiments are not limited thereto. For instance, the transparent area TA may have various shapes, and is not limited to any one embodiment. As shown, the transparent area TA has a rectangular shape with rounded vertices as an example, and as previously mentioned, the transparent area TA may have various shapes, and is not limited to any one embodiment.

The bezel area BZA is an area adjacent to the transparent area TA and is an area in which the image IM is not displayed. The bezel area BZA may have a given color. The bezel area BZA may surround the transparent area TA. Accordingly, the shape of the transparent area TA may be defined by the bezel area BZA; however, embodiments are not limited thereto. For example, the bezel area BZA may be disposed adjacent to only one side of the transparent area TA, or may be omitted.

The display device DD according to some embodiments may sense a user input TC applied from the outside. The user input TC may include various types of external inputs, such as a portion of a body of the user, light, heat, pressure, and/or the like. As seen in FIG. 1, the user input TC is illustrated as the user's finger applied to the front surface. However, this is illustrated by way of example, and as described above, the user input TC may be provided in various types. In addition, the display device DD may sense the user input TC applied to a side surface or the back surface of the display device DD depending on a structure of the display device DD, but again, embodiments are not limited thereto.

The display device DD may activate the display surface IS to display the image IM and may sense (e.g., simultaneously sense) the user input TC. It is illustrated that an area for sensing the user input TC is provided in the transparent area TA where the image WI is displayed, however, this is illustrated by way of example. For instance, the area for sensing the user input TC may be provided in the bezel area BZA, all areas of the display surface IS, or any other suitable arrangement.

Figure 2A:
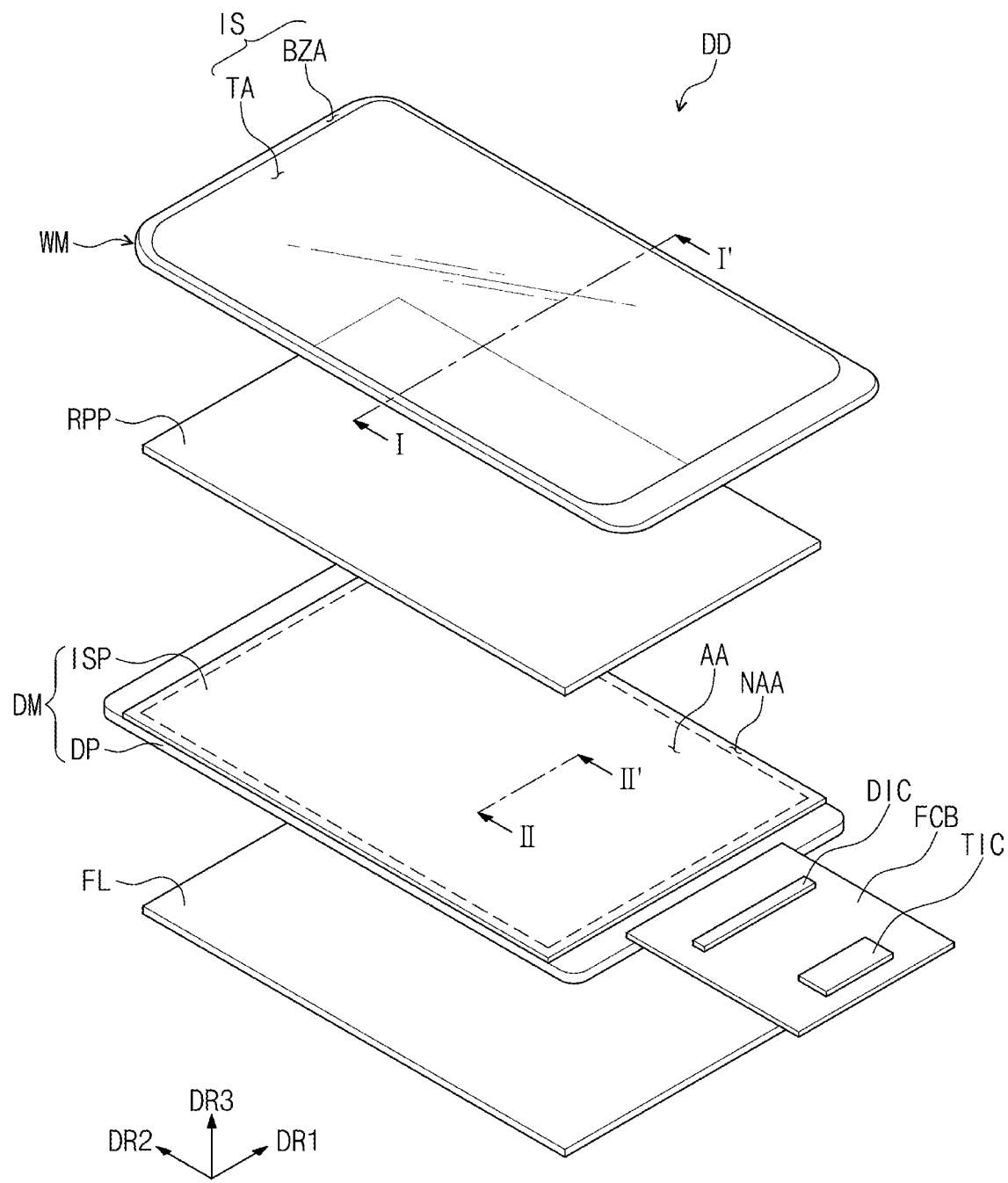
FIG. 2A is an exploded perspective view of a display device according to an is embodiment.
Figure 2B:
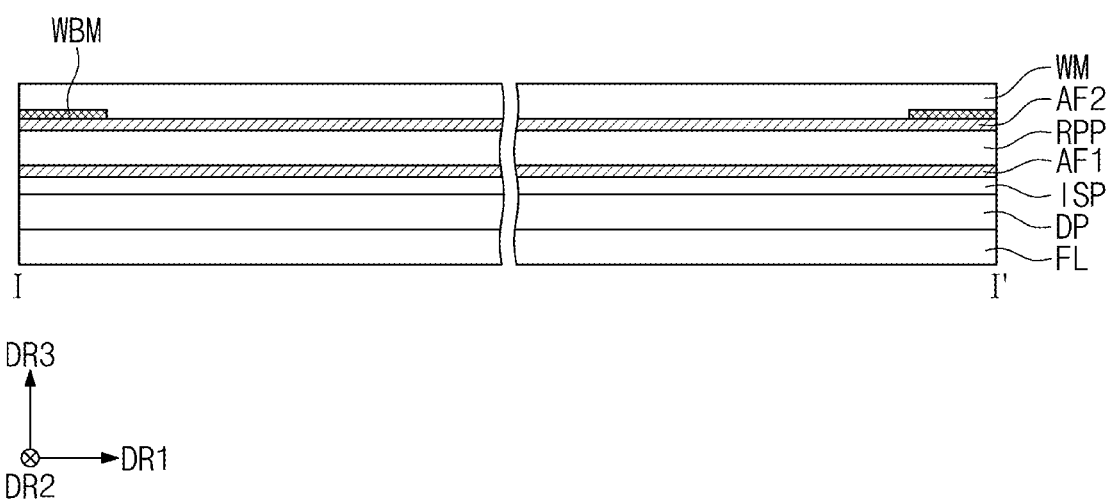
FIG. 2B is a cross-sectional view of the display device of FIG. 2A taken along sectional line I-I' according to an embodiment.
Figure 2C:
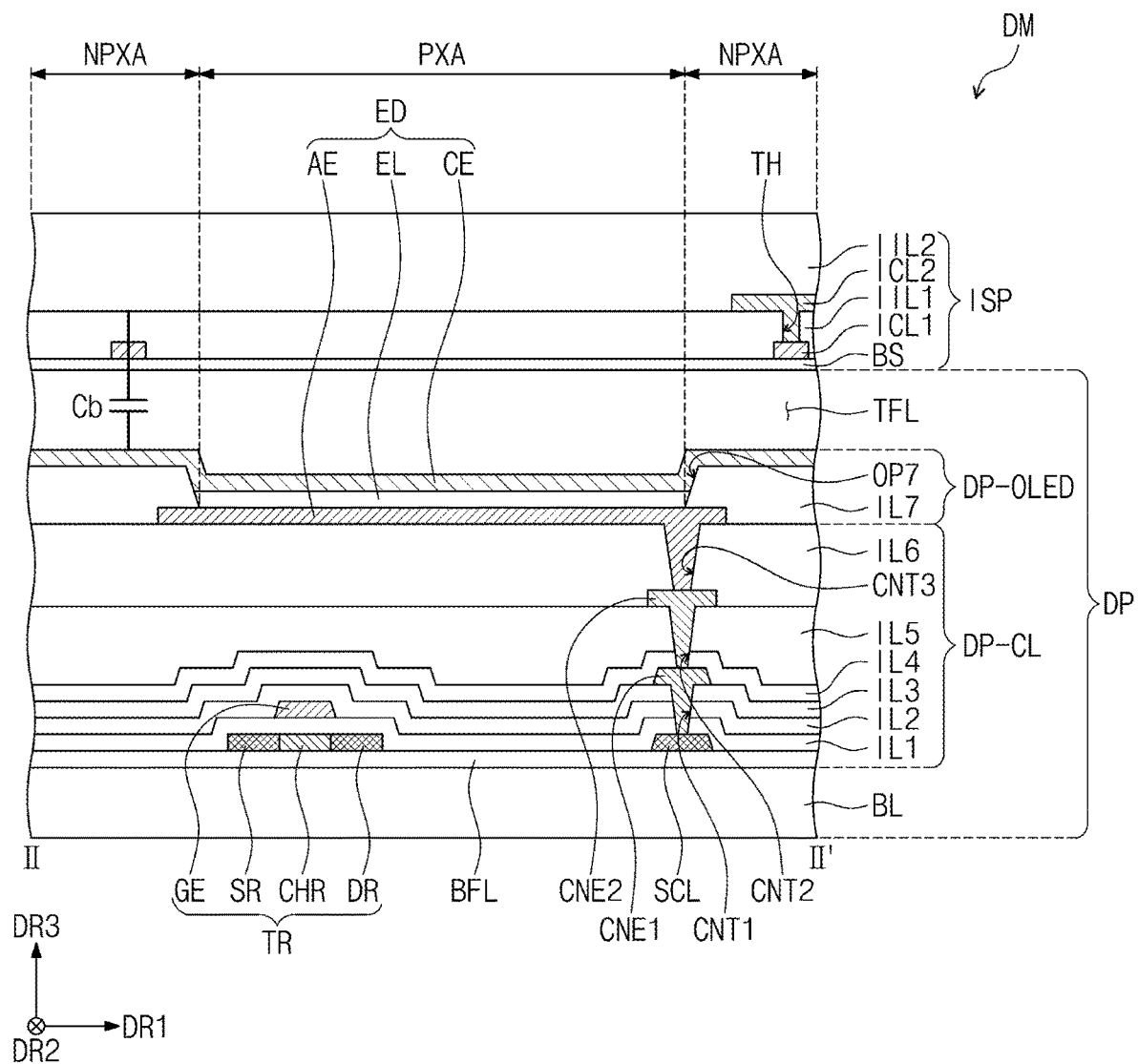
FIG. 2C is a cross-sectional view of the display device of FIG. 2A taken along sectional line II-IF according to an embodiment.

FIG. 2A is an exploded perspective view of the display device DD according to an embodiment. FIG. 2B is a cross-sectional view of the display device DD taken along sectional line I-I' illustrated in FIG. 2A according to an embodiment. FIG. 2C is a cross-sectional view of the display device DD taken along sectional line II-II' illustrated in FIG. 2A according to an embodiment.

Referring to FIGS. 2A and 2B, the display device DD may include a window WM, an anti-reflection film RPP, a display module DM, a flexible circuit film FCB, and a functional layer FL.

The window WM may be disposed on the display module DM. The window WM is may protect the display module DM from the outside. The window WM may include an optically transparent insulating material. Accordingly, an image (e.g., image IM) generated via the display module DM may be easily recognized by a user through the window WM. The window WM transmits an image from the display module DM, as well as relieves an external shock, thereby preventing the display module DM from being damaged or malfunctioning due to the external shock. The external impact is a force from the outside that can be expressed as pressure, stress, etc., and means a force that might otherwise cause a defect in the display module DM.

In an embodiment, the window WM may include at least one of glass and synthetic resin. For example, the window WM may include at least one of glass, polyimide (Pl), and polyethylene terephthalate (PET). For example, the window WM may be thin glass or a synthetic resin film.

The window WM may have a multi-layer structure or a single-layer structure. For example, the window WM may include a plurality of synthetic resin films bonded with an adhesive, or a glass substrate and a synthetic resin film bonded with an adhesive. The window WM may be made of a flexible material.

For example, the window WM may include a light blocking pattern WBM for defining the bezel area BZA. The light blocking pattern WBM may be a colored organic layer, and may be formed, for example, by a coating method.

In an embodiment, the anti-reflection film RPP for blocking external light reflection may be disposed between the display module DM and the window WM.

A second adhesive film AF2 may be disposed between the window WM and the anti-reflection film RPP. The second adhesive film AF2 may include at least one of an optically clear adhesive film (OCA), an optically clear adhesive resin (OCR), and a pressure sensitive adhesive film (PSA); however, embodiments are not limited thereto.

The anti-reflection film RPP may prevent (or reduce) an issue that elements constituting the display module DM are visually recognized from the outside by external light incident through the front surface of the display device DD. The anti-reflection film RPP may include a retarder and a polarizer. The retarder may be a film type or liquid crystal coating type, and may include a λ/2 retarder and/or a λ/4 retarder. The polarizer may also be a film type or a liquid crystal coating type. The film type may include a stretched synthetic resin film, and the liquid crystal coating type may include liquid crystals arranged in a given arrangement. The retarder and the polarizer may be implemented as one polarizing film. A protective film may be further disposed on or below the anti-reflection film RPP.

The anti-reflection film RPP may be disposed on the display module DM. A first adhesive film AF1 may be disposed between the display module DM and the anti-reflection film RPP. The first adhesive film AF1 may include at least one of an optically clear adhesive film (OCA), an optically clear adhesive resin (OCR), and a pressure sensitive adhesive film (PSA), but embodiments are not limited thereto.

The display module DM includes a display panel DP and an input sensor ISP. The display panel DP may generate the image IM, and the input sensor ISP may sense an external input (such as user input TC) applied from the outside. The external input may be a user input, and may include, for example, various types of inputs, such as a portion of the user's body, light, heat, a pen, pressure, and/or the like.

The display panel DP according to an embodiment may be a light emitting display panel, but is not particularly limited. For example, the display panel DP may be an organic light is emitting display panel or a quantum dot light emitting display panel. A light emitting layer of the organic light emitting display panel may include an organic light emitting material, and a light emitting layer of the quantum dot light emitting display panel may include quantum dots, quantum rods, etc. Hereinafter, the display panel DP will be described as the organic light emitting display panel.

The input sensor ISP may be disposed on the display panel DP. In an embodiment, the input sensor ISP may be directly disposed on the display panel DP. For example, the input sensor ISP may be formed on the display panel DP by a continuous process. For the purposes of this disclosure, the phrases "directly disposed on" or "disposed directly on" may be understood as that a third component is not disposed between the input sensor ISP and the display panel DP.

Embodiments, however, are not limited to the above-noted configuration. For example, an adhesive film may be disposed between the input sensor ISP and the display panel DP. In this case, the input sensor ISP is not manufactured by a continuous process with the display panel DP, but is manufactured through a process separate from the display panel DP, and then may be disposed on, for instance, the upper surface of the display panel DP and coupled thereto by an adhesive film.

FIG. 2C illustrates a cross-sectional view of an example of the display module DM according to an embodiment. As an example, it is illustrated that the display module DM includes the display panel DP and the input sensor ISP disposed directly on the display panel DP, but embodiments are not limited thereto.

Referring to FIG. 2C, the display panel DP may include a base layer BL, a circuit layer DP-CL, a light emitting device layer DP-OLED, and an encapsulation layer TFL.

The base layer BL may provide a base surface on which the circuit layer DP-CL is disposed. The base layer BL may include a synthetic resin layer. The base layer BL may have a multi-layered structure. For example, the base layer BL may have a three-layer structure of a synthetic resin layer, an adhesive layer, and a synthetic resin layer. For instance, the synthetic resin layer may be a polyimide-based resin layer, but the material of the synthetic resin layer is not particularly limited. The synthetic resin layer may include at least one of acrylic resins, methacrylic resins, polyisoprene, vinyl resins, epoxy resins, urethane resins, cellulose resins, siloxane resins, polyamide resins, and perylene resins. Additionally or alternatively, the base layer BL may include a glass substrate or an organic/inorganic composite material substrate.

The circuit layer DP-CL may be disposed on the base layer BL. The circuit layer DP-CL may include an insulating layer, a semiconductor pattern, a conductive pattern, and a signal line. An insulating layer, a semiconductor layer, and a conductive layer are formed on the base layer BL by a method, such as coating or deposition, and then, the insulating layer, the semiconductor layer, and the conductive layer may be selectively patterned through a plurality of photolithography processes. Thereafter, a semiconductor pattern, a conductive pattern, and a signal line included in the circuit layer DP-CL may be formed.

At least one inorganic layer is formed on an upper surface of the base layer BL. The inorganic layer may include at least one of aluminum oxide, titanium oxide, silicon oxide, silicon oxynitride, zirconium oxide, and hafnium oxide. The inorganic layer may be formed in multiple layers. The multiple inorganic layers may compose a barrier layer and/or a buffer layer. A buffer layer BFL may improve a bonding force between the base layer BL and the semiconductor pattern. The buffer layer BFL may include at least one of a silicon oxide layer and a silicon nitride layer. In some embodiments, the silicon oxide layer and the silicon nitride layer may be alternately stacked to form the buffer layer BFL. Although the circuit layer DP-CL is illustrated as including the buffer layer BFL embodiments are not limited thereto, and the buffer layer BFL may be omitted.

The semiconductor pattern may be disposed on the buffer layer BFL. The semiconductor pattern may include polysilicon; however, embodiments are not limited thereto. For instance, the semiconductor pattern may include amorphous silicon or metal oxide.

FIG. 2C only illustrates some semiconductor patterns, and other semiconductor patterns may be further disposed in other areas. The semiconductor pattern may be arranged in a defined arrangement across the pixels. The semiconductor pattern may have different electrical properties depending on whether it is doped or not. The semiconductor pattern may include a first region having high conductivity and a second region having low conductivity. The first region may be doped with an N-type dopant or a P-type dopant. A P-type transistor includes a doped region doped with the P-type dopant. The second region may be a non-doped region or may be doped with a lower concentration than the first region.

The first region has a conductivity greater than that of the second region, and serves the role of an electrode or a signal line. The second region may correspond to an active region (or a channel region) of a transistor. As such, a portion of the semiconductor pattern may be the active region of the transistor, and other portions may be a source region or a drain region to of the transistor.

Each of pixels may have an equivalent circuit including, for instance, seven transistors, one capacitor, and a light emitting device, but the equivalent circuit diagram of the pixel may be modified in various forms. FIG. 2C illustrates one transistor TR and a light emitting device ED included in the pixel.

A source region SR, a channel region CHR, and a drain region DR of the transistor TR may be formed from a semiconductor pattern. The source region SR and the drain region DR may be provided in opposite directions from (or opposite sides of) the channel region CHR in a cross-sectional view. FIG. 2C illustrates a portion of a circuit line SCL disposed on the same layer as the semiconductor pattern. Although not illustrated separately, the circuit line SCL may be electrically connected to the transistor TR on a plane.

A first insulating layer IL1 may be disposed on the buffer layer BFL. The first insulating layer IL1 may overlap the plurality of pixels in common and may cover the semiconductor pattern. The first insulating layer IL1 may be an inorganic layer and/or an organic layer, and may have a single-layer or multi-layer structure. The first insulating layer IL1 may include at least one of aluminum oxide, titanium oxide, silicon oxide, silicon nitride, silicon oxynitride, zirconium oxide, and hafnium oxide. In some embodiments, the first insulating layer IL1 may be a single layer formed as a silicon oxide layer. The insulating layer of the circuit layer DP-CL to be described later, as well as the first insulating layer IL1 may be an inorganic layer and/or an organic layer, and may have a single-layer or multi-layer structure. The inorganic layer may include at least one of the above-described materials, but is not limited thereto.

A gate GE of the transistor TR is disposed on the first insulating layer IL1. The gate GE may be a portion of the metal pattern. The gate GE overlaps the channel region CHR. In the process of doping the semiconductor pattern, the gate GE may serve as a mask.

A second insulating layer IL2 is disposed on the first insulating layer IL1 and may cover the gate GE. The second insulating layer IL2 may overlap the pixels in common. The second insulating layer IL2 may be an inorganic layer and/or an organic layer, and may have a single-layer or multi-layer structure. In some embodiments, the second insulating layer IL2 may be a single layer formed as a silicon oxide layer.

A third insulating layer IL3 may be disposed on the second insulating layer IL2, and in some embodiments, the third insulating layer IL3 may be a single layer formed as a silicon oxide layer. A first connection electrode CNE1 may be disposed on the third insulating layer IL3. The first connection electrode CNE1 may be connected to the circuit line SCL through a contact hole CNT1 passing through the first, second, and third insulating layers ILL IL2, and IL3.

A fourth insulating layer IL4 may be disposed on the third insulating layer IL3. The fourth insulating layer IL4 may be a single layer formed as a silicon oxide layer.

A fifth insulating layer IL5 may be disposed on the fourth insulating layer IL4. The fifth insulating layer IL5 may be an organic layer.

A second connection electrode CNE2 may be disposed on the fifth insulating layer IL5. The second connection electrode CNE2 may be connected to the first connection electrode CNE1 through a contact hole CNT2 passing through the fourth insulating layer IL4 and the fifth insulating layer IL5.

A sixth insulating layer IL6 is disposed on the fifth insulating layer IL5, and may cover the second connection electrode CNE2. The sixth insulating layer IL6 may be an organic layer.

The light emitting device layer DP-OLED may be disposed on the circuit layer DP-CL. The light emitting device layer DP-OLED may include a light emitting device. For example, the light emitting device layer DP-OLED may include an organic light emitting material, quantum dots, quantum rods, and/or micro-LEDs. The light emitting device ED may include a first electrode AE, an emission layer EL, and a second electrode CE.

The first electrode AE may be disposed on the sixth insulating layer IL6. The first electrode AE may be connected to the second connection electrode CNE2 through a contact hole CNT3 passing through the sixth insulating layer IL6.

A pixel defining layer IL7 is disposed on the sixth insulating layer IL6, and may cover a portion of the first electrode AE. An opening OP7 is defined in the pixel defining layer IL7. The opening OP7 of the pixel defining layer IL7 exposes at least a portion of the first electrode AE. In some embodiments, an emission area PXA is defined to correspond to a partial area of the first electrode AE exposed by the opening OP7. A non-emission area NPXA may surround the emission area PXA.

The emission layer EL may be disposed on the first electrode AE. The emission layer EL may be disposed in the opening OP7. For instance, the emission layer EL may be formed separately in each of the pixels. When the emission layer EL is separately formed in each of the pixels, each of the emission layers EL may emit light of at least one color among, for s instance, blue, red, and green. However, embodiments are not limited thereto. For example, the emission layer EL may be connected to the pixels and provided in common. In this case, the emission layer EL may provide, for instance, blue light or white light.

The second electrode CE may be disposed on the emission layer EL. The second electrode CE may have an integral shape and may be commonly disposed in a plurality of pixels. A common voltage may be applied to the second electrode CE, and the second electrode CE may be referred to as a common electrode.

In some embodiments, a hole control layer may be disposed between the first electrode AE and the emission layer EL. The hole control layer may be commonly disposed in the emission area PXA and the non-emission area NPXA. The hole control layer may include a is hole transport layer and may further include a hole injection layer. An electronic control layer may be disposed between the emission layer EL and the second electrode CE. The electron control layer may include an electron transport layer and may further include an electron injection layer. The hole control layer and the electron control layer may be formed in common in the plurality of pixels using, for example, an open mask.

The encapsulation layer TFL may be disposed on the light emitting device layer DP-OLED. The encapsulation layer TFL may include an inorganic layer, an organic layer, and an inorganic layer sequentially stacked, but the layers constituting the encapsulation layer TFL are not limited thereto.

The inorganic layers may protect the light emitting device layer DP-OLED from moisture and oxygen, and the organic layer may protect the light emitting device layer DP-OLED from foreign substances, such as dust particles. The inorganic layers may include at least one of a silicon nitride layer, a silicon oxy nitride layer, a silicon oxide layer, a titanium oxide layer, and an aluminum oxide layer. The organic layer may include, but is not limited to, an acrylic-based organic layer.

The input sensor ISP may be directly disposed on the display panel DP. The input sensor ISP may include a base layer BS, a first conductive layer ICL1, a first sensor insulating layer TILL a second conductive layer ICL2, and a second sensor insulating layer IIL2.

The base layer BS may be an inorganic layer including at least one of silicon nitride, silicon oxynitride, and silicon oxide. Alternatively, the base layer BS may be an organic layer including at least one of an epoxy resin, an acrylic resin, and an imide-based resin. The base layer BS may have a single-layer structure or a multi-layer structure stacked along the third direction DR3.

Each of the first conductive layer ICL1 and the second conductive layer ICL2 may include a plurality of patterns having a single-layer structure or a multi-layer structure stacked along the third direction DR3.

The single-layered conductive layer may include a metal layer or a transparent conductive layer. The metal layer may include at least one of molybdenum, silver, titanium, copper, and aluminum, or any suitable alloy thereof. The transparent conductive layer may include a transparent conductive oxide, such as indium tin oxide (ITO), indium zinc oxide (IZO), zinc oxide (ZnO), indium zinc tin oxide (IZTO), etc. In addition, the transparent conductive layer may include a conductive polymer, such as poly(3,4-ethylenedioxythio-phene) (PEDOT), metal nanowires, graphene, etc.

The multi-layered conductive layer may include metal layers. The metal layers may have, for example, a three-layer structure of titanium/aluminum/titanium. The multi-layered conductive layer may include at least one metal layer and at least one transparent conductive layer.

The first sensor insulating layer IIL1 covers the first conductive layer ICL1, and the second sensor insulating layer IIL2 covers the second conductive layer ICL2. Although the first sensor insulating layer IIL1 and the second sensor insulating layer IIL2 are illustrated as a single layer, embodiments are not limited thereto.

At least one of the first sensor insulating layer IIL1 and the second sensor insulating layer IIL2 may include an inorganic layer. The inorganic layer may include at least one of aluminum oxide, titanium oxide, silicon oxide, silicon nitride, silicon oxynitride, zirconium oxide, and hafnium oxide.

Any one of the first sensor insulating layer IIL1 and the second sensor insulating is layer IIL2 may include an organic layer. The organic layer may include at least one of acrylic resin, methacrylic resin, polyisoprene, vinyl-based resin, epoxy-based resin, urethane-based resin, cellulose-based resin, siloxane-based resin, polyimide-based resin, polyamide-based resin, and perylene-based resin.

Referring to FIG. 2A again, the display module DM may display an image in response to an electrical signal, and may transmit/receive information about an external input. The display module DM may be defined as including an active area AA and a peripheral area NAA. The active area AA may be defined as an area emitting an image provided from the display module DM.

The peripheral area NAA is adjacent to the active area AA. For example, the peripheral area NAA may surround the active area AA. However, this is illustrated by way of example, and the peripheral area NAA may be defined in various shapes, and is not limited to any one embodiment.

According to an embodiment, the active area AA of the display module DM may correspond to at least a portion of the transparent area TA.

The functional layer FL may be disposed on the back surface of the display module DM. The functional layer FL may include at least one layer. For example, the functional layer FL may be a metal layer or a cushion layer. The metal layer may support the display module DM. The cushion layer may include a polymer material to absorb an external shock. In addition, the functional layer FL may further include an adhesive layer.

The flexible circuit film FCB is connected to the display module DM. The flexible circuit film FCB may be electrically connected to the display module DM. The flexible circuit film FCB may be bonded to the peripheral area NAA of the display module DM through a bonding process.

The flexible circuit film FCB may further include a panel driving chip DIC and a sensor driving chip TIC. The panel driving chip DIC may be a driving chip mounted on the flexible circuit film FCB and electrically connected to the display panel DP. The panel driving chip DIC may include driving elements for driving the pixels of the display panel DP, for example, a data driving circuit. Although FIG. 2A illustrates a structure in which the panel driving chip DIC is mounted on the flexible circuit film FCB, embodiments are not limited thereto. For instance, the panel driving chip DIC may be disposed on the display panel DP.

The sensor driving chip TIC may be a driving chip mounted on the flexible circuit film FCB and electrically connected to the input sensor ISP. In an embodiment, the sensor driving chip TIC may be electrically connected to electrodes of the input sensor ISP through sensing lines to provide a driving signal to the electrodes. The sensor driving chip TIC may control overall driving of the input sensor ISP. The sensor driving chip TIC may inspect a short-circuit of the input sensor ISP in addition to driving the input sensor ISP. In an embodiment, the sensor driving chip TIC may drive the input sensor ISP in an inspection mode at a low frequency to inspect whether a short-circuit has occurred between electrodes of the input sensor ISP. A more detailed description will be given later.

The flexible circuit film FCB may further include a plurality of driving elements mounted on the flexible circuit film FCB. The plurality of driving elements may include a circuit unit that converts a signal input from the outside into a signal for the panel driving chip DIC and the sensor driving chip TIC, or that converts a signal for driving the display panel DP. The flexible circuit film FCB may be bent and may be disposed on the back surface of the display module DM.

Figure 3:
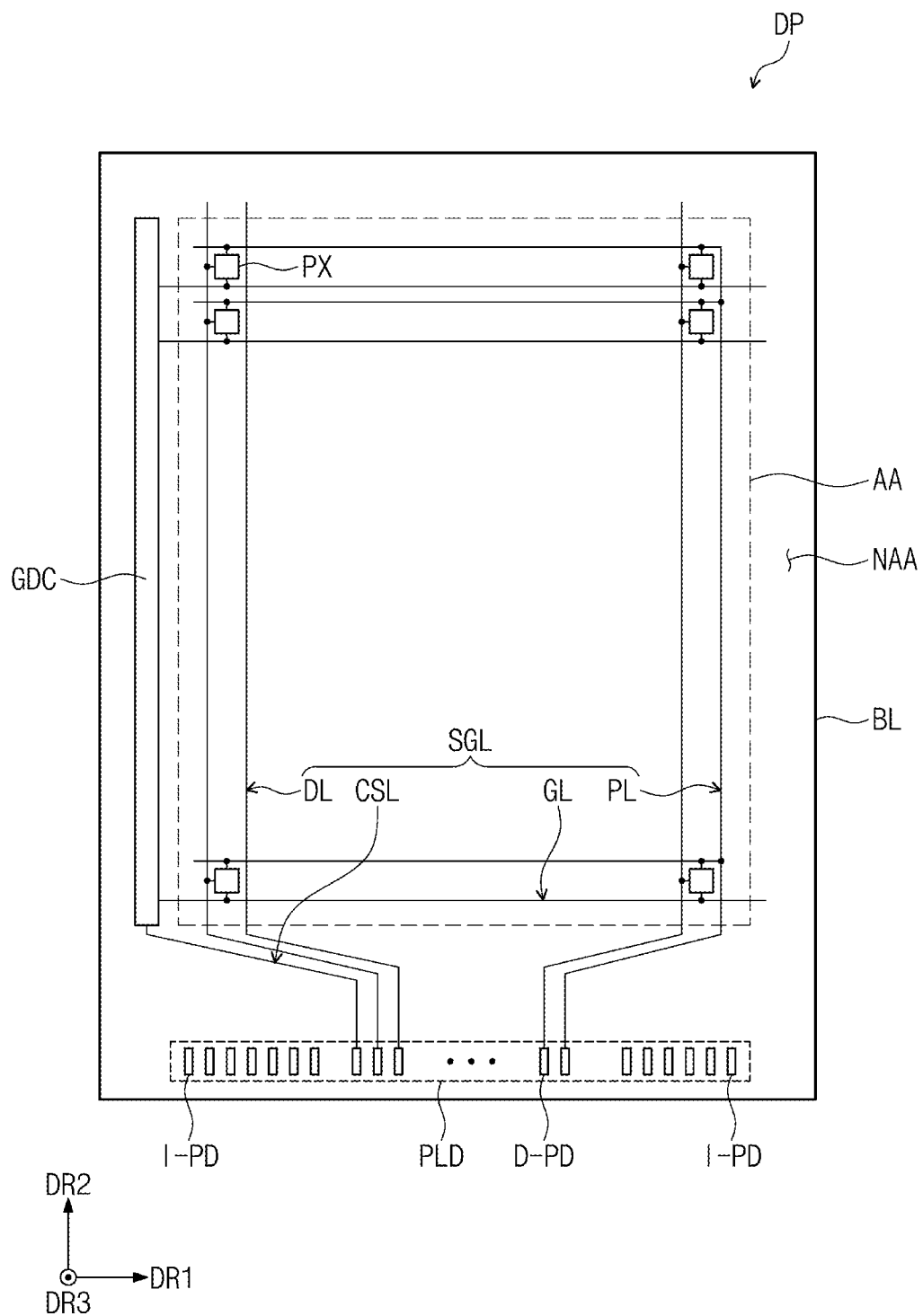
FIG. 3 is a plan view of a display panel according to an embodiment.
Figure 4:
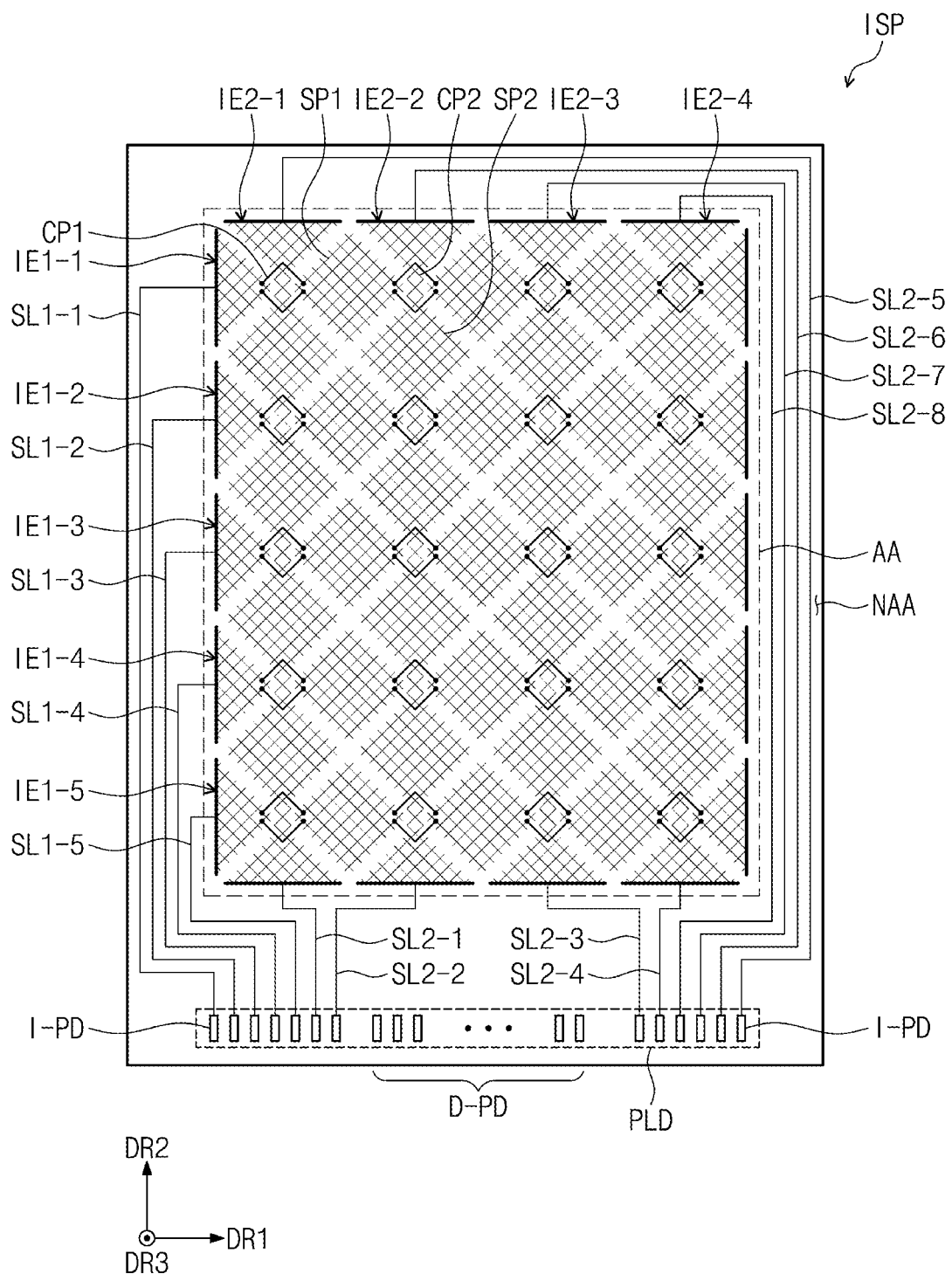
FIG. 4 is a plan view of an input sensor according to an embodiment.

FIG. 3 is a plan view of the display panel DP according to an embodiment. FIG. 4 is a plan view of the input sensor ISP according to an embodiment.

Referring to FIGS. 3 and 4, the display panel DP may include a driving circuit GDC, a plurality of signal lines SGL, a plurality of pixels PX, and a pad part PLD. The pad part PLD is disposed in the peripheral area NAA and includes pixel pads D-PD connected to a corresponding signal line among the plurality of signal lines SGL.

The pixels PX are disposed in the active area AA. Each of the pixels PX includes a light emitting device of the light emitting device layer DP-OLED illustrated in FIG. 2C and a pixel driving circuit connected thereto. The driving circuit GDC, the signal lines SGL, the pad part PLD, and the pixel driving circuit may be included in the circuit layer DP-CL illustrated in FIG. 2C.

The driving circuit GDC may include a gate driving circuit. The gate driving circuit generates a plurality of gate signals (hereinafter, gate signals) and sequentially outputs the gate signals to a plurality of gate lines GL (hereinafter, gate lines) to be described later. The gate driving circuit may further output another control signal to a pixel driving circuit.

The signal lines SGL include the gate lines GL, data lines DL, a power line PL, and a control signal line CSL. One gate line of the gate lines GL is connected to a corresponding pixel PX among the pixels PX, and one data line of the data lines DL is connected to a corresponding pixel PX of the pixels PX. The power line PL is connected to the pixels PX. The control signal line CSL may provide control signals to the gate driving circuit. The signal lines SGL overlap the active area AA and the peripheral area NAA.

The pad part PLD is a part to which the flexible circuit film FCB (refer to FIG. 2A) is connected, and may include the pixel pads D-PD for electrically connecting the flexible circuit film FCB to the display panel DP and input pads I-PD for electrically connecting the flexible circuit film FCB to the input sensor ISP.

The pixel pads D-PD are connected to the corresponding pixels PX through the signal lines SGL. Also, the driving circuit GDC may be connected to any one of the pixel pads D-PD.

Referring to FIG. 4, the input sensor ISP according to an embodiment may include first sensing electrodes IE1-1 to IE1-5, first sensing lines SL1-1 to SL1-5 connected to the first sensing electrodes IE1-1 to IE1-5, second sensing electrodes IE2-1 to IE2-4, and second sensing lines SL2-1 to SL2-4 connected to the second sensing electrodes IE2-1 to IE2-4. As an example, the input sensor ISP may further include third sensing lines SL2-5 to SL2-8 connected to the second sensing electrodes IE2-1 to IE2-4. In this case, the second sensing lines SL2-1 to SL2-4 are connected to one end of the second sensing electrodes IE2-1 to IE2-4, and the third sensing lines SL2-5 to SL2-8 may be connected to the other end of the second sensing electrodes IE2-1 to IE2-4.

The first sensing electrodes IE1-1 to IE1-5 and the second sensing electrodes IE2-1 to IE2-4 may be disposed to cross each other. The first sensing electrodes IE1-1 to IE1-5 are arranged (e.g., spaced apart from one another) in the second direction DR2 and extend in the first direction DR1, respectively. The second sensing electrodes IE2-1 to IE2-4 are arranged in the first direction DR1 and extend in the second direction DR2, respectively. The first sensing electrodes IE1-1 to IE1-5 and the second sensing electrodes IE2-1 to IE2-4 may be isolated from each other to form a capacitance.

Each of the first sensing electrodes IE1-1 to IE1-5 includes first sensor parts SP1 and first connection parts CP1 disposed in the active area AA. Each of the second sensing electrodes IE2-1 to IE2-4 includes second sensor parts SP2 and second connection parts CP2 is disposed in the active area AA. Among the first sensor parts SP1, the two first sensor units disposed at both ends of a first electrode among the first sensing electrodes IE1-1 to IE1-5 may have a size less than that of the first sensor unit disposed at a central portion, for example, ½ size. Among the second sensor parts SP2, the two second sensor units disposed at both ends of a second electrode among the second sensing electrodes IE2-1 to IE2-4 may have a size less than that of the second sensor unit disposed at a central portion, for example, ½ size.

FIG. 4 illustrates the first sensing electrodes IE1-1 to IE1-5 and the second sensing electrodes IE2-1 to IE2-4 according to an embodiment, but the shape is not limited thereto. In an embodiment, the first sensing electrodes IE1-1 to IE1-5 and/or the second sensing electrodes IE2-1 to IE2-4 have a shape (e.g., a bar shape) in which there is no distinction between the sensor unit and the connection unit. Although diamond-shaped first sensor parts SP1 and the second sensor parts SP2 are illustratively shown, embodiments are not limited thereto. For example, the first sensor parts SP1 and the second sensor parts SP2 may have different polygonal shapes. For instance, the first sensor parts SP1 and the second sensor parts SP2 may have a bar shape, or any other suitable shape.

In each of the first sensing electrodes IE1-1 to IE1-5, the first sensor parts SP1 are arranged along the first direction DR1, and in each of the second sensing electrodes IE2-1 to IE2-4, the second sensor parts SP2 are arranged along the second direction DR2. Each of the first connection parts CP1 may connect adjacent first sensor parts SP1, and each of the second connection parts CP2 may connect adjacent second sensor parts SP2.

In an embodiment, the first sensing electrodes IE1-1 to IE1-5 and the second sensing electrodes IE2-1 to IE2-4 may have a mesh shape. As the first sensing electrodes IE1-1 to IE1-5 and the second sensing electrodes IE2-1 to IE2-4 have the mesh shape, a capacitance Cb formed between sensing electrodes (e.g., one or more of the first sensing electrodes IE1-1 to IE1-5 and the second sensing electrodes IE2-1 to IE2-4) and the display panel DP (refer to FIG. 2C) may be reduced.

Each of the mesh-shaped first sensing electrodes IE1-1 to IE1-5 and the second sensing electrodes IE2-1 to IE2-4 may have a single-layer structure, or a multi-layer structure stacked along the third direction DR3. The single-layered conductive layer may include a metal layer or a transparent conductive layer. The metal layer may include at least one of molybdenum, silver, titanium, copper, aluminum, and alloys thereof. The transparent conductive layer may include a transparent conductive oxide, such as indium tin oxide (ITO), indium zinc oxide (IZO), zinc oxide (ZnO), indium zinc tin oxide (IZTO), etc. In addition, the transparent conductive layer may include a conductive polymer, such as poly(3,4-ethylenedioxythiophene) (PEDOT), metal nanowires, graphene, etc.

The first sensing lines SL1-1 to SL1-5 may be respectively connected to one end of the first sensing electrodes IE1-1 to IE1-5. In another embodiment, the input sensor ISP may further include sensing lines connected to the other ends of the first sensing electrodes IE1-1 to IE1-5.

The first sensing lines SL1-1 to SL1-5, the second sensing lines SL2-1 to SL2-4, and the third sensing lines SL2-5 to SL2-8 may be disposed in the peripheral area NAA. The pad part PLD may include the input pads I-PD that are extended from one ends of the first sensing lines SL1-1 to SL1-5, the second sensing lines SL2-1 to SL2-4, and the third sensing lines SL2-5 to SL2-8, and are disposed in the peripheral area NAA.

Figure 5A:
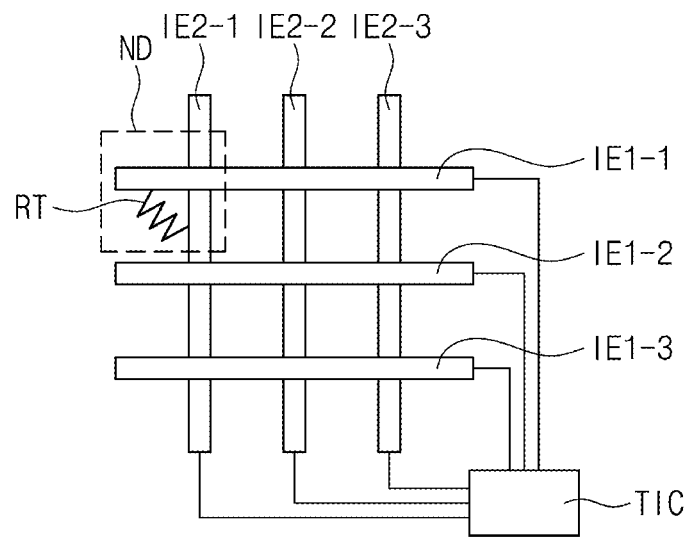
FIGS. 5A and 5B are diagrams illustrating an inspection mode of an input sensor according to an embodiment.
Figure 5B:
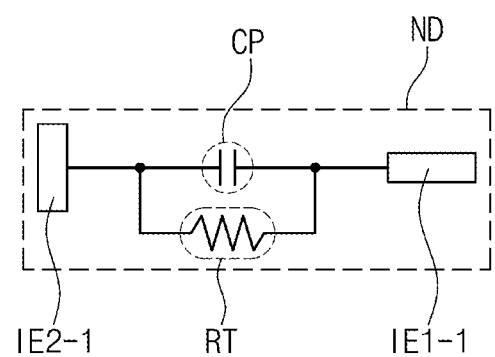

FIGS. 5A and 5B are diagrams illustrating an inspection mode of an input sensor according to an embodiment. FIG. 5A illustrates first sensing electrodes IE1-1 to IE1-3 and second sensing electrodes IE2-1 to IE2-3. FIG. 5B illustrates an enlarged view of one of the plurality of nodes ND defined between the first sensing electrodes IE1-1 to IE1-3 and the second sensing electrodes IE2-1 to IE2-3.

Referring to FIGS. 5A and 5B, the input sensor ISP (refer to FIG. 4) may include the bar-shaped first sensing electrodes IE1-1 to IE1-3 and second sensing electrodes IE2-1 to IE2-3 crossing each other. The first sensing electrodes IE1-1 to IE1-3 and the second sensing electrodes IE2-1 to IE2-3 may be electrically connected to the sensor driving chip TIC.

The sensor driving chip TIC drives the first sensing electrodes IE1-1 to IE1-3 and the second sensing electrodes IE2-1 to IE2-3. For example, the sensor driving chip TIC may apply a driving signal to any one of the first sensing electrodes IE1-1 to IE1-3 and the second sensing electrodes IE2-1 to IE2-3, and may drive the input sensor ISP by receiving a sensing signal from the other of the first sensing electrodes IE1-1 to IE1-3 and the second sensing electrodes IE2-1 to IE2-3. A sensing signal received when an input to the input sensor ISP is detected may be obtained through a change in the capacitance between the first sensing electrodes IE1-1 to IE1-3 and the second sensing electrodes IE2-1 to IE2-3.

In an embodiment, a capacitor CP between the first sensing electrodes IE1-1 to IE1-3 and the second sensing electrodes IE2-1 to IE2-3 may be charged with charges. When an input (e.g., a user's touch) is applied from the outside when the input sensor ISP is driven in a sensing mode for sensing an input, the capacitance charged between the first sensing electrodes IE1-1 to IE1-3 and the second sensing electrodes IE2-1 to IE2-3 may change. In this case, the input sensor ISP may sense an external input through the change in capacitance.

The first sensing electrodes IE1-1 to IE1-3 and the second sensing electrodes IE2-1 to IE2-3 may be insulated from each other. The input sensor ISP may include the capacitor CP charged in an alternating current (AC) section between the first sensing electrodes IE1-1 to IE1-3 and the second sensing electrodes IE2-1 to IE2-3, and a resistor RT charged in a direct current (DC) section. For example, the plurality of nodes ND at which each of the first sensing electrodes IE1-1 to IE1-3 and the second sensing electrodes IE2-1 to IE2-3 intersect may include the capacitor CP and the resistor RT. In this case, the capacitance charged in the input sensor ISP may be determined by adding a charging amount charged in the capacitor CP and the resistor RT disposed in each of the plurality of nodes ND. Accordingly, the capacitance charged between the first sensing electrodes IE1-1 to IE1-3 and the second sensing electrodes IE2-1 to IE2-3 of the input sensor ISP may vary depending on the change in the charging amount of the resistor RT.

When the short-circuit occurs in the input sensor ISP, the resistance RT may converge to zero. The short-circuit of the input sensor ISP may occur between one or more of the first sensing electrodes IE1-1 to IE1-3 and/or one or more of the second sensing electrodes IE2-1 to IE2-3, but is not limited thereto. For instance, the short-circuit may occur between the first sensing electrodes IE1-1 to IE1-3 and may occur between the second sensing electrodes IE2-1 to IE2-3.

When a short-circuited node is a resistor RT having a small size, an amount of charge in the shorted node will be noticeably larger compared to an amount of charge in other adjacent nodes. For instance, as the size of the resistor RT decreases, it may be easier to detect the short. When the size of the resistor RT reaches several megaohms (Mohms) (e.g., 1 Mohm to 20 Mohm in Table 1), it is called a micro short, and it may be difficult to detect the short in a high frequency driving situation. A method of driving the input sensor ISP in an inspection mode driven at a low frequency, which is an inspection frequency, and detecting the micro short will be described in more detail.

In the inspection mode, the sensor driving chip TIC may drive the input sensor ISP at the inspection frequency. The inspection frequency may be less than the driving frequency and greater than a reference frequency. In this case, the driving frequency may be a minimum frequency for the input sensor ISP to sense an external input. The reference frequency may correspond to a minimum value of a frequency that the sensor driving chip TIC can set for the input sensor ISP. For instance, the inspection frequency may correspond to the lowest frequency in a frequency range supported by the sensor driving chip TIC. For example, the inspection frequency may correspond to 5 kilohertz (KHz) to 100 KHz. In the case of the minimum driving frequency for detecting an external input, it may normally correspond to 100 KHz to 150 KHz. The minimum frequency range supported by the sensor driving chip TIC may correspond to 5 KHz to 10 KHz.

In an embodiment, the input sensor ISP at the inspection frequency may not perform driving to detect an external input. For example, the input sensor ISP may not sense the external input in the inspection mode driven at the inspection frequency. For instance, the sensor driving chip TIC may stop all functions of the input sensor ISP except for the detection of the micro short among functions of the input sensor ISP in the inspection mode.

Table 1 illustrates a difference between a capacitance detected depending on the short resistance and a capacitance with other adjacent nodes when the short occurs at a specific node of the input sensor ISP. Table 1 illustrates the capacitance detected when the sensor driving chip TIC drives the input sensor ISP in the inspection mode at the inspection frequency having a low frequency of 5 KHz to 100 KHz according to the short-circuit inspection method of an input device according to an embodiment. For example, Table 1 provides capacitance measured for each short resistance in a short between the first sensing electrode IE1-1 and the second sensing electrode IE2-1. It is noted that a unit of measure is not provided in Table 1 for the measured capacitance as it is irrelevant in the context of detecting differences in measured capacitances between adjacent nodes.

TABLE 1

| Short resistance | Capacitance | Difference in capacitance with adjacent nodes |
|---|---|---|
| 20 MΩ | 566 | 35 |
| 18 MΩ | 571 | 41 |
| 16 MΩ | 595 | 65 |
| 14 MΩ | 647 | 117 |
| 12 MΩ | 658 | 128 |
| 10 MΩ | 788 | 258 |
| 8 MΩ | 905 | 375 |
| 6 MΩ | 1117 | 587 |
| 4 MΩ | 1610 | 1080 |
| 2 MΩ | 3020 | 2480 |
| 1 MΩ | 4392 | 3850 |

Referring to Table 1, it may be seen that as the short resistance increases, the difference in capacitance with other adjacent nodes decreases. In this case, the capacitance of other adjacent nodes may correspond to a normal node in which a short-circuit does not occur. The short-circuit at a specific node of the input sensor ISP may be detected depending on the difference in capacitance with adjacent nodes. For example, in case of the micro short having high short resistance, the short-circuit detection is relatively difficult because the difference in capacitance with other adjacent nodes is small. According to the short-circuit inspection method of the input sensor according to some embodiments, even when the short resistance is as high as 20 MΩ, the difference in capacitance with adjacent nodes is 35 such that the difference is clearly revealed.

In one embodiment, a short-circuit inspection module 600 of the input sensor is determines the corresponding node as a node in which the short-circuit occurs when a difference between the capacitance at a specific node and the capacitance of other adjacent nodes exceeds a predetermined criterion (or threshold value). For example, when the capacitance of a specific node is greater than the capacitance of other adjacent nodes by 7 or more, the short-circuit inspection module 600 of the input sensor ISP may determine the corresponding node as the short-circuit. A more detailed description will be given later.

Figure 6:
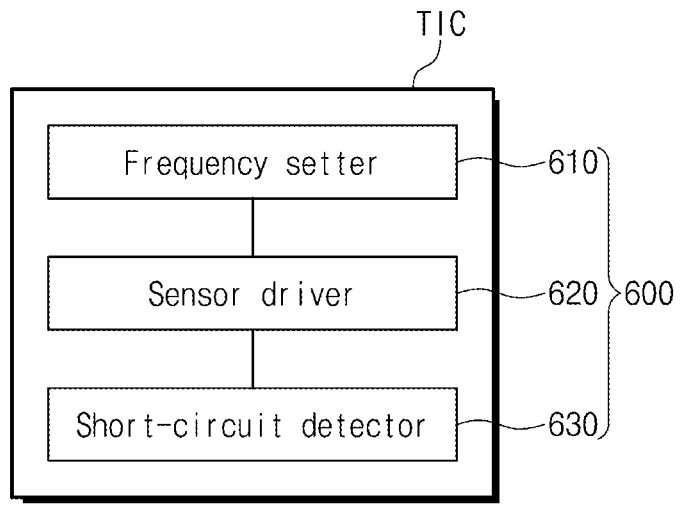
FIG. 6 is a block diagram illustrating a short-circuit inspection module of an input sensor according to an embodiment.
Figure 7:
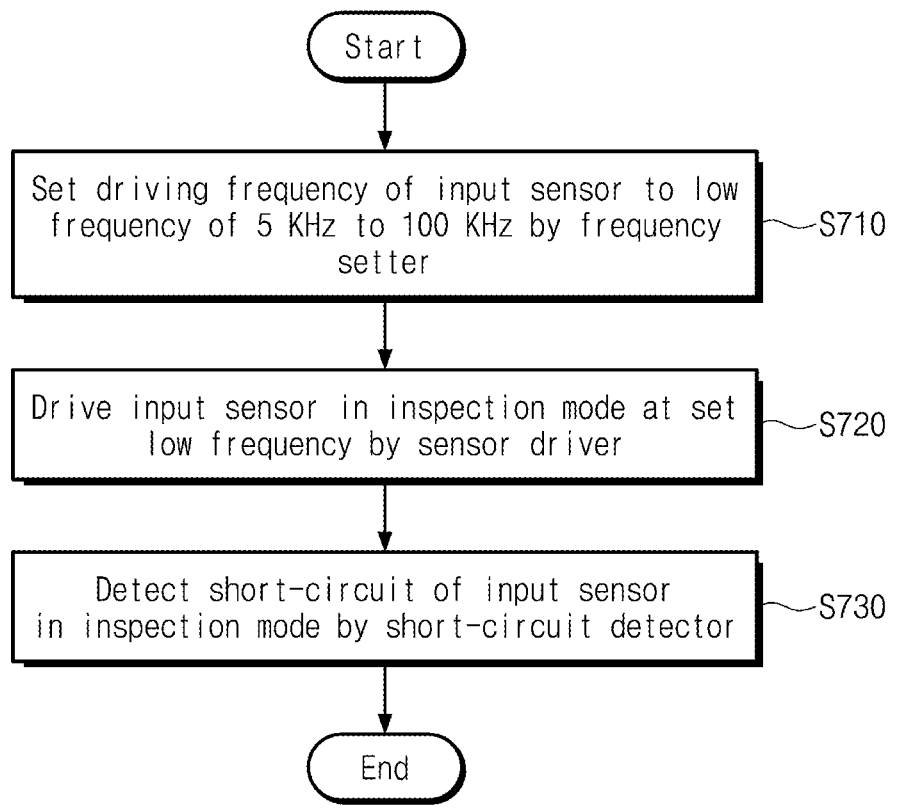
FIG. 7 is a flowchart illustrating a short-circuit inspection method of an input sensor according to an embodiment.

FIG. 6 is a block diagram illustrating a short-circuit inspection module of an input sensor according to an embodiment. FIG. 7 is a flowchart illustrating a short-circuit inspection method of an input sensor according to an embodiment.

Referring to FIG. 6, the sensor driving chip TIC may include the short-circuit inspection module 600 of the input sensor ISP. In an embodiment, the short-circuit inspection module 600 of the input sensor ISP may receive a command from the sensor driving chip TIC in detecting the short-circuit of the input sensor ISP. The short-circuit inspection module 600 of the input sensor ISP may include a frequency setter 610, a sensor driver 620, and a short-circuit detector 630.

The frequency setter 610 may set a frequency of the input sensor ISP (refer to FIG. 4) as the inspection frequency. The frequency setter 610 may set the inspection frequency to a low frequency. For example, the frequency setter 610 may set the frequency of the input sensor ISP to 5 KHz to 100 KHz.

The sensor driver 620 may drive the input sensor ISP at the inspection frequency. For example, the sensor driver 620 may drive the input sensor ISP in the inspection mode. In this case, the inspection mode may mean a state in which the input sensor ISP is driven at the inspection frequency less than the driving frequency, and does not perform a function of detecting an external input.

The short-circuit detector 630 may detect the short-circuit of the input sensor ISP in the inspection mode. The short-circuit detector 630 may detect the short-circuit based on the capacitance between the first sensing electrodes IE1-1 to IE1-5 and the second sensing electrodes IE2-1 to IE2-4 of the input sensor ISP. For example, the short-circuit detector 630 may detect the short occurring in a specific node based on the capacitance of the plurality of nodes ND (refer to FIG. 5) defined between the first sensing electrodes IE1-1 to IE1-5 and the second sensing electrodes IE2-1 to IE2-4. For example, when the capacitance charged in a specific node is different from the capacitance of other adjacent nodes by more than a predetermined criterion, the short-circuit detector 630 may determine that the short-circuit is occurred in the corresponding node.

In FIG. 7, in the method of short-circuit inspection of the input sensor, the input sensor ISP may be driven in the inspection mode at the inspection frequency to inspect for a short-circuit of the input sensor ISP.

The frequency setter 610 may set the driving frequency of the input sensor ISP to the inspection frequency (operation S710). The inspection frequency may correspond to a low frequency of 5 KHz to 100 KHz.

The sensor driver 620 may drive the input sensor ISP in the inspection mode (operation S720). The inspection mode may correspond to a state in which all other functions not for detecting the short in the input sensor ISP are deactivated.

The short-circuit detector 630 may detect a difference in the capacitance of the plurality of nodes ND and may determine that a specific node in which a difference occurs over a certain level has the short-circuit (operation S730).

Figure 8:
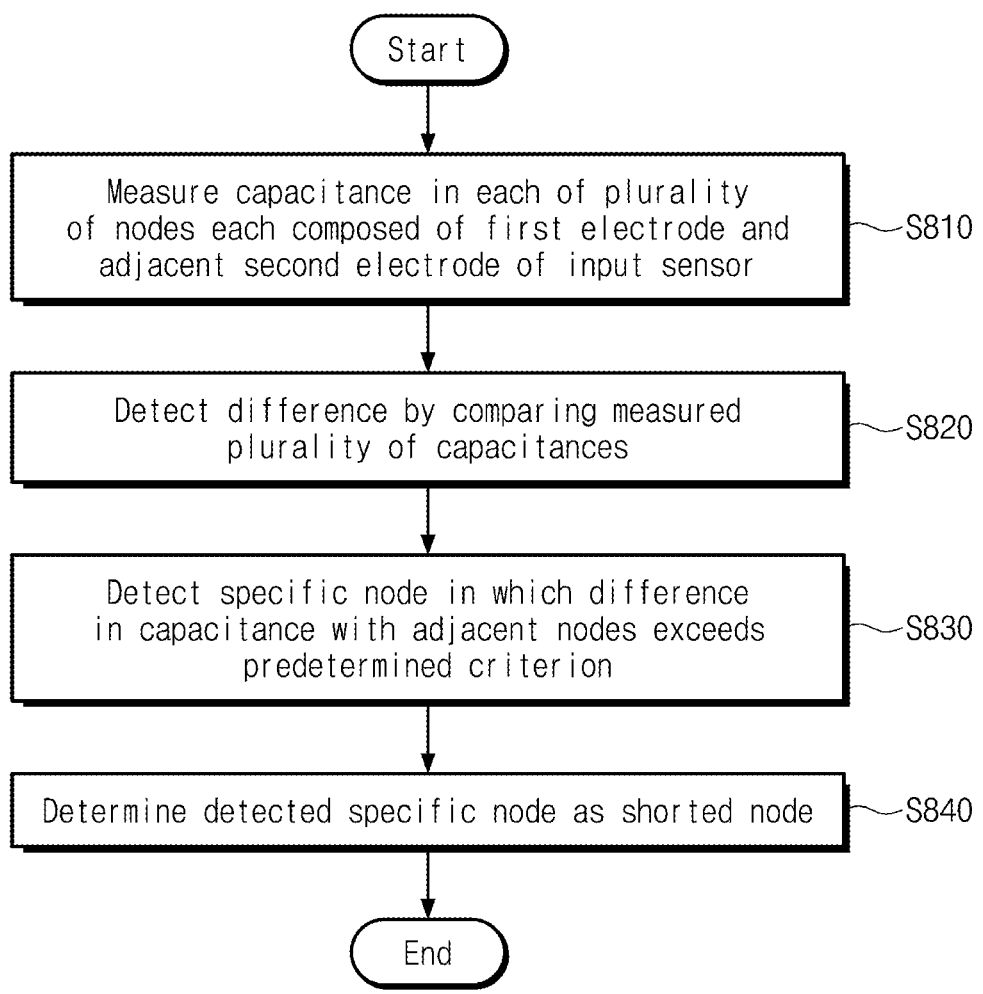
FIG. 8 is a flowchart illustrating a short-circuit detection operation of an input sensor according to an embodiment.

FIG. 8 is a flowchart illustrating a short-circuit detection operation of an input sensor according to an embodiment. For instance, FIG. 8 illustrates an operation in which the short-circuit detector 630 of FIG. 7 detects the short-circuit of the input sensor ISP according to an embodiment.

The short-circuit detector 630 may measure the capacitance in each of the plurality of nodes ND (refer to FIG. 5) (operation S810).

The short-circuit detector 630 may detect a difference by comparing a plurality of capacitances measured at each node with each other (operation S820).

The short-circuit detector 630 may detect a specific node having a capacitance in which a difference from the capacitance measured in adjacent nodes exceeds a predetermined criterion (operation S830).

The short-circuit detector 630 may determine the detected specific node as a shorted node (operation S840).

Figure 9:
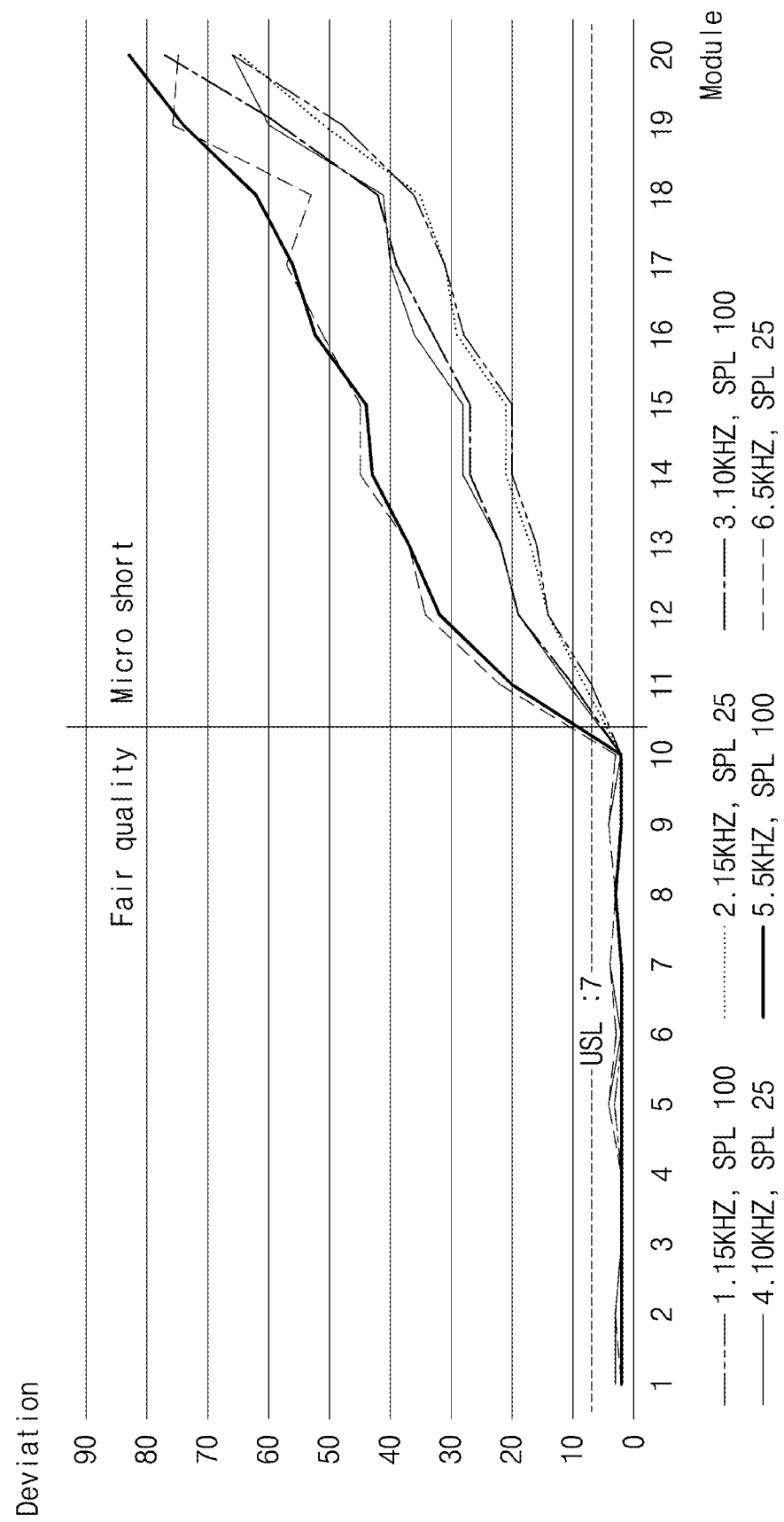
FIG. 9 is a graph illustrating a short-circuit inspection result of an input sensor according to an embodiment.

FIG. 9 is a graph illustrating a short-circuit inspection result of an input sensor according to an embodiment.

The short-circuit inspection method of the input sensor may further include a sampling operation. The sampling operation may be performed by the short-circuit detector 630 (refer to FIG. 6). In the sampling operation, the short-circuit detector 630 may measure the capacitance of the plurality of nodes ND (refer to FIG. 5) at the inspection frequency several times. The short-circuit detector 630 may measure the capacitance at each of the plurality of nodes, may perform sampling SPL for detecting a difference between the measured capacitances twice or more, and may determine (e.g., calculate) an average value associated with the difference in the detected capacitance.

The short-circuit detector 630 may adjust the number of times of sampling SPL for measuring capacitance in the plurality of nodes ND. For example, the short-circuit detector 630 may adjust the number of sampling SPL to 25 times or 100 times. The number of times of sampling SPL may be proportional to the driving time of the input sensor in the inspection mode. When the driving time is longer, the inspection time increases, but the detection signal of the shot-circuit is stabilized, and the inspection accuracy may be increased.

In an embodiment, the short-circuit detector 630 may adjust the number of sampling SPL based on the inspection frequency. The short-circuit detector 630 may reduce the number of sampling times as the inspection frequency decreases. As the inspection frequency decreases, the difference between the capacitance of the shorted node and the capacitance of adjacent normal nodes may increase. In addition, as the number of sampling increases, it is possible to accurately measure the difference in capacitance between nodes. Therefore, the to short-circuit detector 630 may increase the accuracy of short detection by reducing the inspection frequency or increasing the number of sampling. For example, the short-circuit detector 630 may determine the number of samplings SPL to 25 when the inspection frequency is close to 5 KHz, and may determine the number of samplings SPL to 100 when the inspection frequency is close to 100 KHz.

FIG. 9 graphically illustrates a detection aspect of a micro-short under different conditions in which the inspection frequency and the sampling number are different.

In FIG. 9, a deviation of a y-axis may mean a difference in capacitance with other adjacent nodes. Module on an x-axis may mean different nodes ND (refer to FIG. 5) from 1 to 20. Module may correspond to a case where the short-circuit is severe as it advances from 1 to 20. Referring to FIG. 9, cases up to module 10 are normal, and modules 11 to 20 may correspond to shorted nodes. In an embodiment, it may be determined that the input sensor is shorted when the capacitance of a specific node exceeds a predetermined criterion USL compared to the capacitance of other adjacent nodes. In this case, the predetermined criterion USL may correspond to an upper limit of the capacitance difference, for example, may correspond to 7. For instance, in FIG. 9, the modules 11 to 20 that correspond to a module having a deviation exceeding 7 may be determined as the micro short.

FIG. 9 illustrates deviations depending on the conditions of 1 to 6. In a case of condition 1, it illustrates a deviation detected in each module according to 100 sampling times at an inspection frequency of 15 KHz. In a case of condition 2, it illustrates a deviation (difference in capacitance with neighboring nodes) detected in each module according to 25 sampling times at an inspection frequency of 15 KHz. Referring to the condition 1 and the condition 2, the difference in the graph according to the number of sampling at the frequency of 15 KHz is slight.

In a case of condition 3 and condition 4, sampling times of 100 times and 25 times are respectively at an inspection frequency of 10 KHz. In the condition 3 and condition 4, it may be seen that compared with the condition 1 and the condition 2, as the frequency decreases, the deviation becomes larger.

In a case of condition 5 and condition 6, it illustrates a deviation according to the sampling number of 100 times and 25 times, respectively, at the lowest frequency of 5 KHz. In the condition 5 and the condition 6, it may be seen that the difference in the graph appears larger than in the condition 1 and the condition 2 according to the difference in the number of sampling times. This is because the deviation may be measured more precisely as the inspection frequency decreases.

The short-circuit inspection module 600 (refer to FIG. 6) of the input sensor ISP according to various embodiments may drive the input sensor ISP at an inspection frequency lower than a minimum driving frequency for detecting an input of the input sensor ISP to detect a micro short. The short-circuit inspection module 600 of the input sensor ISP may increase or decrease the number of samplings for measuring capacitance charged in a plurality of nodes each configured with a plurality of electrodes at an inspection frequency. In an embodiment, the short-circuit inspection module 600 of the input sensor ISP may increase detection accuracy and may save inspection time at the same time by appropriately adjusting the inspection frequency and the number of samplings.

According to various embodiments, a short-circuit inspection module of an input sensor and a short-circuit inspection method of the input sensor using the same may effectively detect a micro short occurring between electrodes in the input sensor by driving the input sensor at a low frequency.

Although certain embodiments and implementations have been described herein, other embodiments and modifications will be apparent from this description. Accordingly, the inventive concepts are not limited to such embodiments, but rather to the broader scope of the accompanying claims and various obvious modifications and equivalent arrangements as would be apparent to one of ordinary skill in the art.

What is claimed is:

1. An input sensor short-circuit inspection method comprising:
    setting an inspection frequency for detecting a short-circuit of an input sensor comprising a plurality of electrodes;
    driving the input sensor in an inspection mode at the set inspection frequency; and
    detecting the short-circuit of the input sensor based on a capacitance charged between adjacent electrodes among the plurality of electrodes of the input sensor in the inspection mode.

2. The input sensor short-circuit inspection method of claim 1, wherein:
    the inspection frequency is greater than or equal to a reference frequency and less than or equal to a driving frequency of the input sensor;
    the reference frequency is a minimum frequency of the input sensor; and
    the driving frequency is a minimum frequency at which the input sensor can detect an external input.

3. The input sensor short-circuit inspection method of claim 2, wherein the inspection frequency is 5 KHz to 100 KHz.

4. The input sensor short-circuit inspection method of claim 1, wherein, in the inspection mode, the input sensor does not perform a function of detecting an external input.

5. The input sensor short-circuit inspection method of claim 1, wherein:
    the plurality of electrodes comprises first electrodes and second electrodes crossing the first electrodes; and
    detecting the short-circuit comprises detecting a short between at least two of the first electrodes, a short between at least two of the second electrodes, or a short between at least one of the first electrodes and at least one of the second electrodes.

6. The input sensor short-circuit inspection method of claim 5, wherein:
    a plurality of nodes is defined in the input sensor, each of the plurality of nodes comprising a first electrode among the first electrodes and a second electrode among the second electrodes adjacent to the first electrode; and
    detecting the short-circuit is based on a difference in capacitance between the plurality of nodes.

7. The input sensor short-circuit inspection method of claim 6, wherein detecting the short-circuit comprises:
    measuring capacitance at each of the plurality of nodes;
    detecting a difference in capacitance between the plurality of nodes; and
    determining the short-circuit with respect to a node among the plurality of nodes in which a difference in capacitance with nodes adjacent to the node exceeds a predetermined criterion.

8. The input sensor short-circuit inspection method of claim 7, wherein the difference in capacitance is determined based on an amount of charge charged in a resistance between the first electrode and the second electrode at the node.

9. The input sensor short-circuit inspection method of claim 7, wherein:
    detecting the short-circuit further comprises determining an average value of the difference in capacitance for a number of samples; and
    each sample of the number of samples is a repeat of the measuring of the capacitance at each node of the plurality of nodes and the detecting of the difference in capacitance between the plurality of nodes.

10. The input sensor short-circuit inspection method of claim 9, wherein the number of samples is set based on the inspection frequency.

11. The input sensor short-circuit inspection method of claim 10, wherein the inspection frequency is proportional to the number of samples.

12. An input sensor short-circuit inspection module comprising:
a frequency setter configured to set an inspection frequency for detection of a short-circuit of an input sensor, the input sensor comprising a plurality of electrodes;
a sensor driver configured to drive the input sensor at the inspection frequency in an inspection mode; and
a short-circuit detector configured to detect, in the inspection mode, the short-circuit based on a capacitance charged between adjacent electrodes among the plurality of electrodes.

13. The input sensor short-circuit inspection module of claim 12, wherein:
the inspection frequency is greater than or equal to a reference frequency and less than or equal to a driving frequency of the input sensor; and
the reference frequency is a minimum frequency of the input sensor; and
the driving frequency is a minimum frequency at which the input sensor can detect an external input.

14. The input sensor short-circuit inspection module of claim 13, wherein the inspection frequency is 5 KHz to 100 KHz.

15. The input sensor short-circuit inspection module of claim 12, wherein:
the plurality of electrodes comprises first electrodes and second electrodes crossing the first electrodes;
a plurality of nodes is defined in the input sensor, each of the plurality of nodes comprising a first electrode among the first electrodes and a second electrode among the second electrodes adjacent to the first electrode; and
the short-circuit detector is configured to detect the short-circuit based on a difference in capacitance between the plurality of nodes.

16. The input sensor short-circuit inspection module of claim 15, wherein the short-circuit detector is configured to determine the short-circuit with respect to a node among the plurality of nodes in response to a difference in capacitance of the node with adjacent nodes being greater than a predetermined criterion.

17. The input sensor short-circuit inspection module of claim 16, wherein the short-circuit detector is configured to adjust a number of sampling times for the detection of the difference in capacitance between the plurality of nodes based on the inspection frequency.

18. The input sensor short-circuit inspection module of claim 17, wherein the short-circuit detector is configured to set the inspection frequency proportional to the number of sampling times.

19. An apparatus comprising:
at least one processor; and
at least one memory comprising one or more sequences of one or more instructions that, in response to being executed by the at least one processor, cause the apparatus at least to:
set an inspection frequency for detection of a short-circuit of an input sensor, the input sensor comprising a plurality of electrodes;
drive the input sensor in an inspection mode at the set inspection frequency; and
detect the short-circuit of the input sensor based on capacitances charged between adjacent electrodes among the plurality of electrodes in the inspection mode.

20. The apparatus of claim 19, wherein:
in a detection mode, the input sensor is configured to detect an external input via the plurality of electrodes; and
in the inspection mode, the input sensor is not in the detection mode.

* * * * *